United States Patent
Willmeroth et al.

(10) Patent No.: US 8,502,281 B2
(45) Date of Patent: *Aug. 6, 2013

(54) INTEGRATED CIRCUIT HAVING VERTICAL COMPENSATION COMPONENT

(75) Inventors: Armin Willmeroth, Augsburg (DE); Holger Kapels, Holzkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 13/277,820

(22) Filed: Oct. 20, 2011

(65) Prior Publication Data

US 2012/0032255 A1   Feb. 9, 2012

Related U.S. Application Data

(63) Continuation of application No. 11/623,571, filed on Jan. 16, 2007, now Pat. No. 8,063,419.

(30) Foreign Application Priority Data

Jan. 16, 2006  (DE) .......................... 10 2006 002 065

(51) Int. Cl.
  *H01L 29/66*  (2006.01)
  *H01L 29/78*  (2006.01)
  *H01L 27/088*  (2006.01)

(52) U.S. Cl.
  USPC ........... 257/263; 257/285; 257/328; 257/329; 257/330; 257/331; 257/332; 257/333; 257/334; 257/335; 257/339; 257/341; 257/342; 257/401; 257/E29.256

(58) Field of Classification Search
  USPC ........................................................ 257/263
  See application file for complete search history.

(56) References Cited

U.S. PATENT DOCUMENTS

| 5,528,058 | A | 6/1996 | Pike et al. |
| 6,309,920 | B1 | 10/2001 | Laska et al. |
| 6,384,431 | B1 * | 5/2002 | Takahashi et al. ............ 257/147 |
| 6,639,272 | B2 | 10/2003 | Ahlers et al. |
| 6,885,063 | B2 | 4/2005 | Tagami et al. |
| 7,091,557 | B2 | 8/2006 | Deboy |
| 2002/0079534 | A1 | 6/2002 | Kang et al. |
| 2004/0164348 | A1 * | 8/2004 | Blanchard et al. ............ 257/329 |
| 2005/0230702 | A1 | 10/2005 | Kartal et al. |
| 2006/0211179 | A1 * | 9/2006 | Siemieniec et al. .......... 438/138 |

FOREIGN PATENT DOCUMENTS

| DE | 10147307 A1 | 4/2003 |
| DE | 10147307 A1 * | 4/2003 |
| DE | 10245049 A1 | 4/2004 |

OTHER PUBLICATIONS

Machine translation of DE10245049.*
Machine English translation of DE 10147307A1 to Tihanyi.*
Definition of adjoin. (n.d.) The American Heritage® Dictionary of the English Language, Fourth Edition. (2003). Retrieved Dec. 10, 2012 from http://www.thefreedictionary.com/adjoin.*

(Continued)

*Primary Examiner* — Michael Jung
(74) *Attorney, Agent, or Firm* — Dicke, Billig & Czaja, PLLC

(57) ABSTRACT

An integrated circuit and component is disclosed. In one embodiment, the component is a compensation component, configuring the compensation regions in the drift zone in V-shaped fashion in order to achieve a convergence of the space charge zones from the upper to the lower end of the compensation regions is disclosed.

13 Claims, 4 Drawing Sheets

(56) References Cited

OTHER PUBLICATIONS

Definition of contiguous. (n.d.) The American Heritage® Dictionary of the English Language, Fourth Edition. (2003). Retrieved Dec. 10, 2012 from http://www.thefreedictionary.com/contiguous.*
The Non-Final Office Action for U.S. Appl. No. 11/623,571 mailed Jun. 2, 2009.
The Final Office Action for U.S. Appl. No. 11/623,573 mailed Nov. 16, 2009.
The Non-Final Office Action for U.S. Appl. No. 11/623,571 mailed Aug. 13, 2010.
The Non-Final Office Action for U.S. Appl. No. 11/623,571 mailed Feb. 2, 2011.

* cited by examiner

INTEGRATED CIRCUIT HAVING VERTICAL COMPENSATION COMPONENT

CROSS-REFERENCE TO RELATED APPLICATIONS

This Utility Patent Application is a continuation application of U.S. application Ser. No. 11/623,571, filed Jan. 16, 2007, and claims priority to German Patent Application No. DE 10 2006 002 065.0 filed on Jan. 16, 2006, which is incorporated herein by reference.

BACKGROUND

The present invention relates to an integrated circuit having a compensation component with a reduced and adjustable on resistance. This compensation component may be a vertical compensation component or alternatively a lateral compensation component. In one embodiment, the compensation component is a power field effect transistor.

With respect to compensation components, as is known, there is an extremely extensive prior art concerned with the formation of the compensation regions. In this respect, as examples and representative of further documents, reference shall be made in particular to the following:

U.S. Pat. No. 6,630,698 B1 illustrates a field effect transistor in which compensation regions in the form of p-conducting pillars have a variable doping, so that the p-conducting pillars have a higher doping in a region near the source than in a region near the drain. In this case, the p-conducting pillars always have the same, constant cross-sectional area.

In U.S. Pat. No. 6,639,272 B2, a likewise variable doping in p-conducting pillars of compensation regions is achieved by means of differing layer thickness of individual epitaxial layers in conjunction with the p-conducting pillars having a cross-sectional area that is essentially identical over their length.

Further examples of compensation components comprising compensation regions having a constant cross-sectional area are given by U.S. Pat. No. 4,754,310 A1, U.S. Pat. No. 5,216,275 A1, U.S. Pat. No. 6,621,122 B2 and US 2004/108568 A1.

Furthermore, compensation components using trench technology are known for example from U.S. Pat. No. 6,512,267 B2, U.S. Pat. No. 6,410,958 B1 and U.S. Pat. No. 6,433,385 B1. In these documents, too, the compensation regions have a largely constant cross-sectional area over their length. Only in U.S. Pat. No. 6,433,385 B1 mentioned last is a description given of a trench transistor having an "extended p-zone" (extended p-conducting zone) which is embedded between oxide-filled trenches and acts as a compensation region, here the trench having a smaller cross-sectional area in its lower section than in its upper section, so that the compensation region has a larger cross-sectional area in deeper regions of the drift zone than in less deep regions.

U.S. Pat. No. 6,677,643 B2 discloses a compensation component in which compensation regions have a larger pitch in proximity to the source than in proximity to the drain, whereby structures can arise in which a compensation region having a larger cross-sectional area adjoins a compensation region having a smaller cross-sectional area in a vertical direction between source electrode and drain electrode.

While the conventional compensation components previously mentioned above all have a vertical structure, U.S. Pat. No. 6,858,884 B2 describes a compensation component with a lateral structure, here a compensation region decreasing in terms of its cross-sectional area in the direction between the source electrode and the drain electrode. However, the compensation region extends directly on the drain side as far as a highly doped substrate, so that no "pedestal layer" remains between the substrate and the compensation region. This document does not discuss any relationships between the form of the compensation region and the capacitance profile of the compensation component as a function of the drain-source voltage.

Finally, WO 2005/065385 A2 discloses a compensation component in the form of a field effect transistor in which floating p-conducting compensation regions lie in the drift zone between source and drain, the diameters of the compensation regions decreasing with increasing distance from the source electrode. The aim of reducing the diameter is to produce floating p-conducting regions that are intended to achieve an increased breakdown voltage. Continuous compensation pillars are not provided in the case of this compensation component.

The numerous documents above are cited by way of example for the extensive prior art with respect to compensation components, to which attention has already been drawn. It must be emphasized, however, that in these documents at any rate and also in the other prior art investigated, there is no explicit discussion of the relationship between the form of the compensation regions, that is to say the geometrical shape thereof, and the profile of the capacitance of the compensation component as a function of the voltage present between drain and source, that is to say the output capacitance.

Investigations have now illustrated that especially high-voltage power transistors embodied as compensation components have the particular property that in them the output capacitance is very large given small drain-source voltages, but decreases rapidly by several orders of magnitude as the drain-source voltage increases, the transition between the range with high output capacitance and the range with no output capacitance not in any way being effected in continuous fashion, but rather being effected in stepped fashion.

The above dependence of the output capacitance Coss on the drain-source voltage VDS is qualitatively illustrated schematically in FIG. 1 in a logarithmic representation. The individual steps with which the output capacitance of an investigated compensation field effect transistor falls rapidly as the drain-source voltage VDS increases can clearly be discerned here.

The physical background for this rapid fall in the output capacitance will be explained in more detail below. It should be noted here that the feedback capacitance, that is to say the capacitance between gate and drain, behaves in similar fashion, and it assumes even smaller values than the output capacitance on account of the drain-source capacitance additionally contained in the output capacitance.

FIG. 2 schematically illustrates a p-conducting compensation region 5 in an n-conducting drift zone 2, the pn junction 10 between the compensation region 5 and the drift zone 2 being in pillar-type form. The source contact lies at the upper edge of FIG. 2, while the drain contact is to be assumed at the lower edge.

If 10 V are present between the drain contact and the source contact in the switched-on state of the compensation component, then a space charge zone 9 forms which extends all around the pillar-type compensation region 5 if the interior of the compensation region remains at source potential, but the area surrounding the compensation region 5 in the drift zone 2 rises slowly up to the drain potential on account of the bulk resistance in the drift zone 2. The space charge zone 9 is particularly extended at the lower, drain-side end of the compensation region, so that especially here only a relatively narrowly delimited region remains for the current flow in the drift zone 2.

If, then, a plurality of compensation regions lie with their longitudinal extent parallel to one another between a source contact and a drain contact and the voltage present between drain and source is increased continuously, the space charge zones 9 of the parallel compensation regions will finally converge. At the instant when the space charge zones 9 converge, the geometry and the effective thickness of the space charge zone change significantly, which is manifested in a step in the capacitance profile. The steep fall in the output capacitance (cf. FIG. 1) and its stepped profile are therefore ultimately caused by the convergence of the space charge zones, in which case it should be taken into consideration that the space charge zones first touch one another at the drain-side, lower end of the compensation regions. At this moment when they touch, the entire upper part of the drift path becomes ineffective for the capacitance, whereby the pronounced steps can be explained.

The steep profile of the output capacitance according to the example of FIG. 1 results in steep voltage edges, which are highly unfavorable for the electromagnetic compatibility (EMC behavior) of a circuit that uses such a compensation component. This holds true in particular for the range of large steps in the profile of the output capacitance.

To summarize, therefore, it can be established that a less stepped profile of the output capacitance as a function of the drain-source voltage would be highly favorable for the EMC behavior of a compensation component.

For these and other reasons, there is a need for the present invention.

SUMMARY

One embodiment provides an integrated circuit having a compensation component in which the compensation regions in the drift zone are configured in V-shaped fashion in order thus to achieve a convergence of the space charge zones from the upper to the lower end of the compensation regions. The stepped capacitance profile is thereby smoothed.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
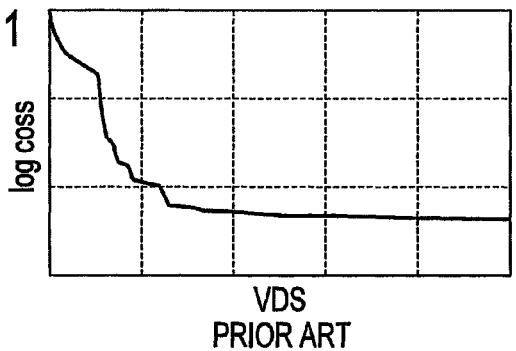
FIG. 1 illustrates the dependence of the output capacitance on the drain-source voltage in the case of a compensation field effect transistor.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the present invention provides an integrated circuit having a compensation component in which the capacitance profile is as smooth as possible in order thus to obtain a favorable EMC behavior, and which is distinguished by a lowest possible on resistance.

In one embodiment, the compensation region or the compensation regions has or have an ever decreasing cross-sectional area with increasing distance from the body zone in the direction between the first and the second electrode, that is to say in particular in the direction between source and drain, so that the compensation region or the compensation regions is or are designed in "V"-shaped fashion. In other words, the compensation pillars are thus configured in V-shaped fashion.

What is achieved by this configuration of the compensation region or the compensation regions is that the abovementioned "pinch-off" or "cut-off" in the upper region of the drift path is prevented by the converging space charge zones. As a consequence, although the steps in the capacitance profile (cf. FIG. 1) are still present, they are nevertheless significantly less pronounced, so that the fall in the capacitance as the drain-source voltage rises is effected more slowly overall. This less stepped capacitance profile has a favorable effect on the EMC behavior of the compensation component.

A further advantage of the V-shaped pillar structure is a reduced on resistance. For the same drain voltage present, the space charge zone penetrates into the for example n-conducting compensation region significantly less in the case of a component according to the invention (cf. FIG. 4a) than in the case of a conventional component (cf. FIG. 4b). Since the cross-sectional area of the n-type region has a huge influence on the on resistance, a structure having in that case V-shaped p-conducting pillars has a significantly improved on resistance. If the compensation component is present in a vertical structure, then it is of importance that the compensation region or the compensation regions is or are all configured in contiguous fashion, that is to say has or have no floating regions. Such floating regions, as can be gathered from WO 2005/065385 A2 already mentioned, are therefore not present in the case of a vertical compensation component according to the invention.

If, by contrast, a compensation component in a lateral structure is involved, then it is of importance that a pedestal region of the drift zone additionally remains between the end of the compensation region in the drift zone and the second zone, that is to say generally the drain zone. In contrast to the lateral semiconductor component disclosed in U.S. Pat. No. 6,858,884 B2, therefore, the compensation region does not reach the drain zone or the highly doped substrate in the case of the lateral compensation component according to the invention.

One embodiment is a field effect transistor. However, the invention is not intended to be restricted thereto since, in principle, it can also be applied to other semiconductor components, such as an IGBT, for example.

In one embodiment, the drift zone is n-conducting, so that the compensation regions have p-type conductivity, that is to say are doped with boron, for example. In principle, however, opposite conductivity conditions may also be present, so that an n-conducting compensation region is embedded into a p-conducting drift zone.

Figure 2:
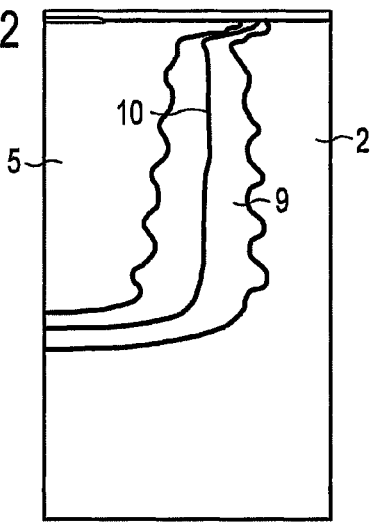
FIG. 2 illustrates the propagation of the space charge zone around a compensation region with a conventional construction.

In the Figures, the same reference symbols are used in each case for mutually corresponding structural parts. FIGS. 1 and 2 have already been explained in the introduction.

Figure 3A:
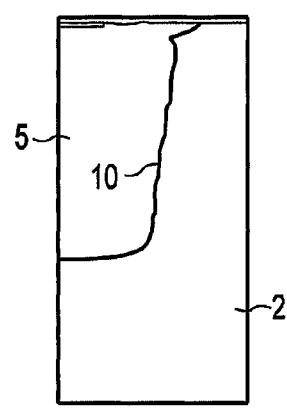
FIGS. 3A and 3B illustrate the profile of the pn junction of the compensation region in the case of the compensation component according to the invention (FIG. 3A) and in the case of a conventional compensation component (FIG. 3B).
Figure 3B:
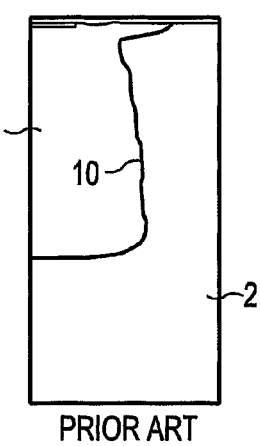

FIGS. 3A and 3B illustrate the profile of the pn junction 10 between a p-conducting compensation region 5 and an n-conducting drift zone 2 in one embodiment of a compensation component according to the invention (cf. FIG. 3A) and in the case of a conventional compensation component (cf. FIG. 3B), in which case, in order to illustrate the invention, in the case of the conventional compensation component the compensation pillar, that is to say the compensation region 5, is even somewhat widened in the direction from source (top) to drain (bottom), while a significant narrowing of the cross-sectional area of the compensation region 5 in the direction from source to drain is present in the case of the compensation component according to the invention.

Figure 4A:
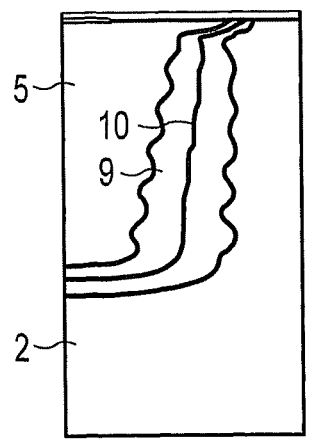
FIGS. 4A and 4B illustrate the propagation of the space charge zone in the case of a compensation region of the compensation component according to the invention (FIG. 4A) and in the case of a compensation region of a conventional compensation component (FIG. 4B).
Figure 4B:
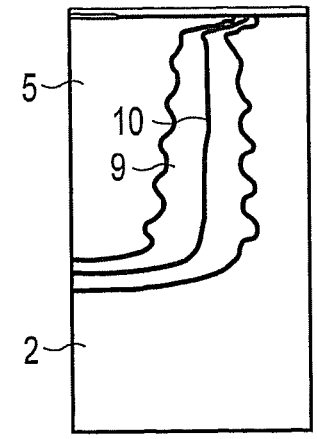

FIGS. 4A and 4B illustrate the extent of the space charge zone 9 in the region of the pn junction 10 between a p-conducting compensation region 5 and an n-conducting drift zone 2 in the case of the compensation component according to the invention (cf. FIG. 4A) and in the case of a conventional compensation component (cf. FIG. 4B). In the case of the conventional compensation component (cf. FIG. 4B), the space charge zone 9 extends furthest toward the "right" in the lower region of the "pillar", of the compensation region 5, in this Figure, so that upon the "convergence" of two space charge zones 9 of adjacent compensation regions, a pinch-off of the overlying regions of the drift zone occurs, which in turn causes the stepped and abrupt profile of the output capacitance as a function of the drain-source voltage. It can be gathered from FIG. 4A that this "pinch-off" does not occur here since here the space charge zone 9 does not particularly project in the lower region of the "pillar".

Figure 5:
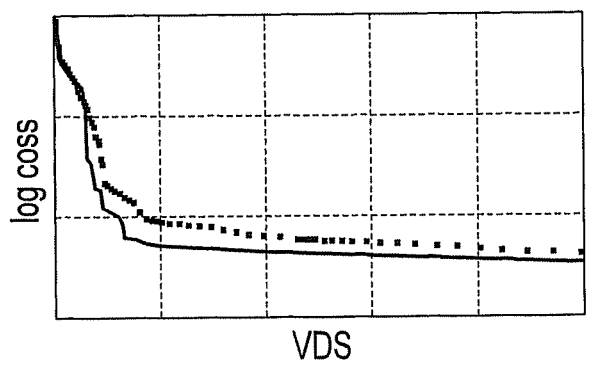
FIG. 5 illustrates, in a comparison, the profile of the output capacitance as a function of the drain-source voltage in the case of a conventional compensation component and in the case of a compensation component according to the invention.

FIG. 5 illustrates the simulated capacitance profiles, the dependence of the output capacitance Coss on the drain-source voltage VDS, using a solid line, according to the illustration of FIG. 1, for a conventional compensation component (field effect transistor) and using a dash-dotted line for a compensation component according to the invention. In the case of the compensation component according to the invention, although steps are still present in the capacitance profile, they nonetheless appear in significantly less pronounced fashion. A "smoother" fall in the output capacitance arises, so that the latter falls more slowly as the drain-source voltage rises. This can be attributed to the fact that, in the case of the compensation component according to the invention, the individual space charge zones for adjacent "compensation pillars" (cf. FIG. 4A) merge together from top to bottom, so that a pinch-off of the overlying drift zone is likewise effected from top to bottom.

In the case of the compensation component according to the invention, on account of the extent of the space charge zone explained above, in the switched-on state, the region remaining for the current flow of the electrons is preserved such that it has approximately the same width from top to bottom (cf. once again FIG. 4a).

This means that a significantly increased conductivity and a lower on resistance result for the compensation component according to the invention in comparison with a conventional compensation component having a customary compensation pillar, so that for example with the gate activated (10 V are present at the gate), the drain current depending on the drain voltage is increased by approximately 7.5%. With a rising drain voltage which increases to 10 V, for example, in the case of the compensation component according to the invention the drain current is in each case increased by approximately 7.5% in comparison with the conventional compensation component.

Figure 6:
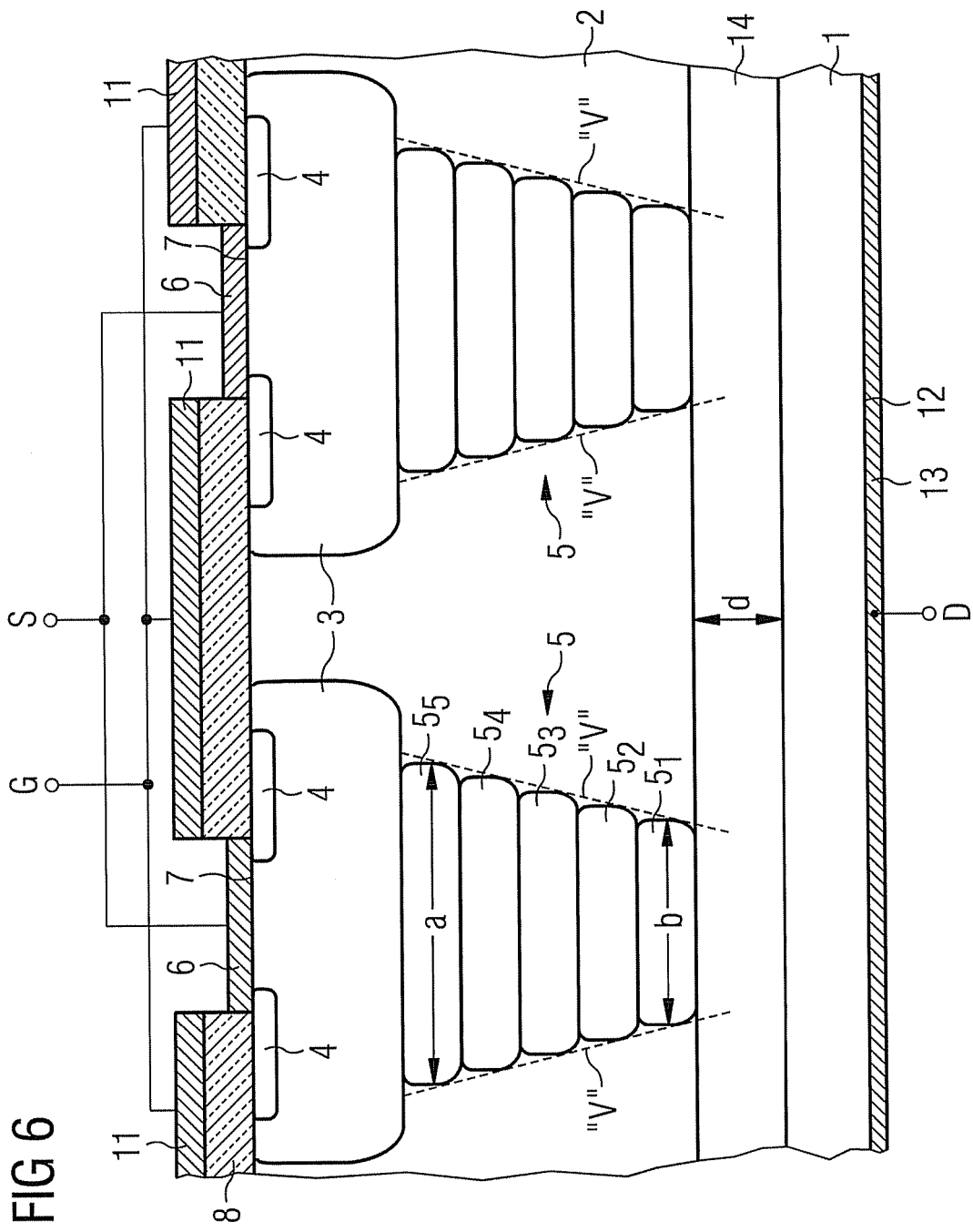
FIG. 6 illustrates a sectional illustration through a vertical compensation component according to the invention.

In one embodiment, a vertical compensation component according to the invention in the form of a field effect transistor having a source electrode S, a drain electrode D and a gate electrode G will be explained in more detail below with reference to FIG. 6.

An $n^-$-conducting drift zone 2 is situated on an $n^+$-doped semiconductor substrate 1 made of silicon, for example, p-doped body zones 3 being introduced into the drift zone. The p-doped body zones 3 contain heavily n-doped source zones 4 provided with source contacts 6 for the source electrode S. For the rest, an upper main surface 7 of the semiconductor body is covered by an insulating layer 8 made of silicon dioxide and/or silicon nitride, on which gate contacts 11 for the gate electrode G are in turn situated.

The lower main surface 12 opposite to the main surface 7 is provided with a drain contact 13 for the drain electrode D.

P-doped compensation regions 5 are situated in the drift zone 2 in each case below the body zones 3 and in a manner adjoining the latter. In this embodiment, the compensation regions 5 generally have a V-shaped configuration (cf. the dashed lines "V"). They have a cross-sectional area which decreases with increasing distance from the main surface 7 and decreasing distance to the main surface 12, as can be seen from FIG. 6 by virtue of dimensions a and b of the cross-sectional area of the compensation region 5 (compensation pillar) at the ends of the region 5 that are near the source and near the drain, respectively. This "decreasing" of the cross-sectional area is illustrated by the dimensions a and b of the ends of the region 5 that are near the source and near the drain, respectively. In this embodiment, the area ratio $b^2/a^2$ of the cross-sectional area is so small that it is at any rate smaller than the area ratio which results automatically (also without a change in the implantation openings) on account of the dopant concentration that is varied in the vertical direction (as proposed, e.g., in U.S. Pat. No. 6,630,698 B1). Values for the area ratio $b^2/a^2$ are at most 0.95 and in one embodiment 0.5 to 0.8. The compensation regions essentially run parallel to one another.

The compensation regions 5, the body zones 3 and the source zones 4 can be produced in a customary manner, that is to say for example by individual epitaxy steps for individual zones $5_1, 5_2, 5_3, 5_4, 5_5$ forming a compensation region 5 and by means of implantation and/or diffusion for the body zone 3 or the source zone 4.

Optionally, an n-conducting pedestal region 14 may additionally be present at the lower end of the compensation regions 5 in the drift zone 2. If the pedestal region 14 is not present, then the drift zone 2 directly adjoins the semiconductor substrate 1. A preferred width for the pedestal region 14 is at least 2 µm and, for example in the case of a 600 V component, approximately 10 to 20 µm.

Figure 7A:
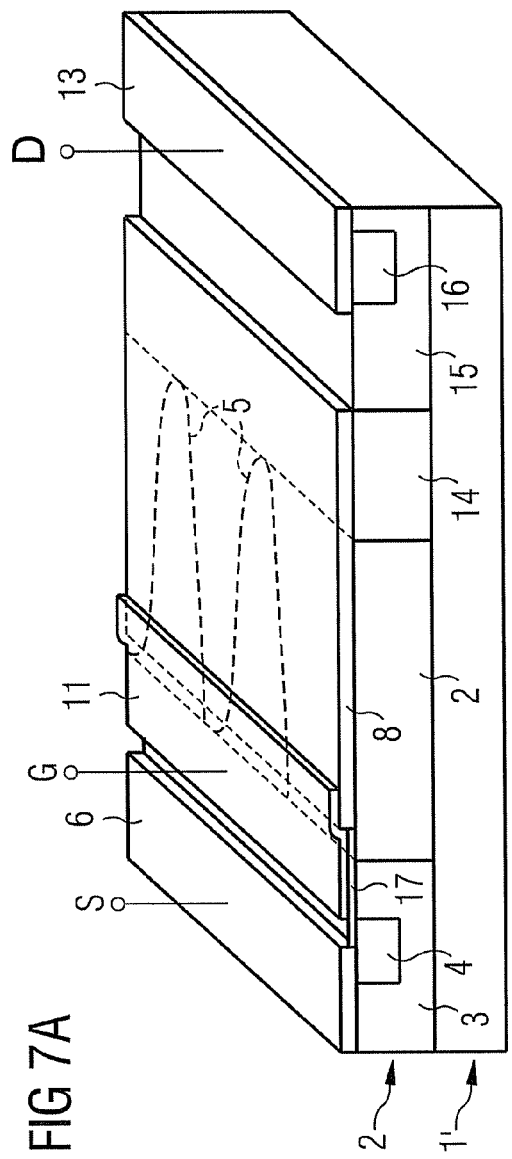
FIGS. 7A and 7B illustrate a lateral compensation component, FIG. 7A showing the latter in perspective, while the construction of the compensation regions is additionally represented separately in FIG. 7B for illustration purposes.
Figure 7B:
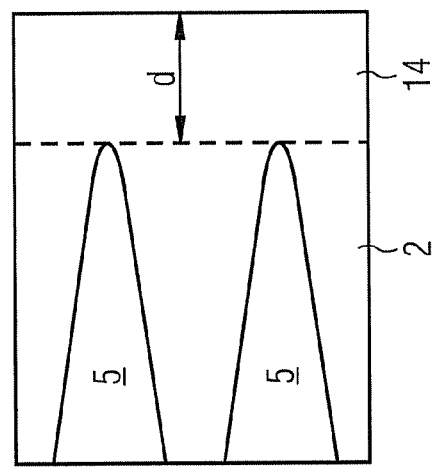

FIGS. 7A and 7B additionally illustrate an exemplary embodiment of the lateral compensation component according to the invention in the form of a field effect transistor. In this case, FIG. 7A is a perspective view, while FIG. 7B only illustrates the embedding of the compensation regions 5 into the drift zone 2 in plan view.

In this embodiment, there are situated on a dielectric substrate 1' an $n^-$-conducting drift zone 2, a p-conducting body zone 3, an n-conducting source zone 4 embedded into the latter, an n-conducting drain zone 15 with an $n^+$-conducting contact region 16 for the drain contact 13 of the drain electrode D, an insulating layer 8 made of silicon dioxide and/or silicon nitride, a gate layer 11 for the gate electrode G with a gate oxide 17 between the body zone 3 and the gate layer 11, and a source contact 6 for the source electrode S.

According to one embodiment, V-shaped compensation regions 5 are embedded into the drift zone 2, which compensation regions are p-doped like the body zone 3, adjoin the latter and run essentially parallel to one another. Situated at the lower end of the compensation regions 5 is an n-doped pedestal region 14, which is at any rate more highly doped than the $n^-$-doped drift zone 2 and has a somewhat weaker doping concentration than the drain zone 15. The width d of the pedestal region 14 is once again at least 2 µm and, in the case of a 600 V component, approximately 10 to 20 µm. The pedestal region 14 is present in the case of the lateral compensation component, whereas it is only optionally provided in the case of the vertical compensation component, as was explained above.

Silicon is used as semiconductor material for the compensation component according to one embodiment of the invention. However, it is also possible to use other semiconductor materials, such as, for example, SiC, etc. Suitable dopants are, as has already been mentioned, boron for the p-type conductivity and phosphorus or arsenic for the n-type conductivity. By way of example, aluminum and the like may be used as materials for the contact layers.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A vertical component comprising:
   a semiconductor body of a first conductivity type, having a first main surface and a second main surface opposite the first main surface;
   a first electrode arranged on the first main surface;
   a second electrode arranged on the second main surface;
   a semiconductor substrate of the first conductivity type, the semiconductor substrate adjoining the second electrode;
   a first zone of the first conductivity type, the first zone adjoining the first electrode;
   a body zone of a second conductivity type, the body zone adjoining the first electrode;
   a drift zone of the first conductivity type that lies between the semiconductor substrate and the body zone; and
   at least one compensation region located in the drift zone configured continuously in a connection direction between the first electrode and the second electrode in pillar-type fashion and extending with its longitudinal direction parallel to a connecting direction between the first electrode and the second electrode, wherein the compensation region has a tapering cross-sectional area in the direction toward the second electrode, wherein the compensation region extends in the drift zone proceeding from the body zone toward the semiconductor substrate only to an extent such that a pedestal region of the drift zone remains between the end of the compensation region and the semiconductor substrate and in a manner adjoining the semiconductor substrate, and wherein the pedestal region includes a higher doping concentration than a part of the drift zone adjoining the body zone.

2. The vertical component of claim 1, wherein the drift zone is weakly doped relative to the first zone and the body zone.

3. The vertical component of claim 1,
   wherein a thickness of the pedestal region in a direction between the first electrode and the second electrode is at least 2 µm.

4. The vertical component as claimed in claim 3, wherein a thickness of the pedestal region is 10 µm to 20 µm.

5. The vertical component as claimed in claim 1, wherein an area ratio between the cross-sectional areas of the compensation region at an end thereof near the second electrode and at an end thereof near the first electrode is less than a corresponding area ratio which is established in the case of implantation by means of masks with a constant opening and vertically varied doping.

6. The vertical component as claimed in claim 5, wherein the area ratio between the cross-sectional areas of the compensation region at an end thereof near the second electrode and at an end thereof near the first electrode is less than 0.95.

7. The vertical component as claimed in claim 6, wherein the area ratio between the cross-sectional areas of the compensation region at an end thereof near the second electrode and at an end thereof near the first electrode is between 0.50 and 0.80.

8. The vertical component as claimed in claim 1, wherein the component is a power transistor.

9. The vertical component as claimed in claim 1, wherein the first conductivity type is an n conductivity type.

10. The vertical component as claimed in claim 9, wherein the compensation region is doped with boron.

11. The vertical component as claimed in claim 1, wherein a plurality of compensation regions run substantially parallel to one another between the first electrode and the second electrode.

12. The vertical component as claimed in claim 1, wherein the drift zone directly adjoins the semiconductor substrate.

13. The vertical component as claimed in claim 1, wherein the tapering cross-sectional area is defined by an envelope curve that delimits an edge of individual zones of the compensation region.

* * * * *